United States Patent [19]
Kang et al.

[11] Patent Number: 6,031,281
[45] Date of Patent: Feb. 29, 2000

[54] SEMICONDUCTOR INTEGRATED CIRCUIT DEVICE HAVING DUMMY BONDING WIRES

[75] Inventors: Je Bong Kang; Young Yee Song; Si Chan Sung, all of Asan, Rep. of Korea

[73] Assignee: Samsung Electronics Co., Ltd., Suwon, Rep. of Korea

[21] Appl. No.: 09/115,828

[22] Filed: Jul. 15, 1998

[30] Foreign Application Priority Data

Nov. 21, 1997 [KR] Rep. of Korea ..................... 97-61644

[51] Int. Cl.⁷ .................................................. H01L 23/48
[52] U.S. Cl. ........................ 257/692; 257/676; 257/784; 257/786; 257/787
[58] Field of Search .................................. 257/667, 787, 257/692, 786, 668, 676, 674, 784; 438/126, 127

[56] References Cited

U.S. PATENT DOCUMENTS

| | | | |
|---|---|---|---|
| 5,045,919 | 9/1991 | Nagaoka ................................. | 257/786 |
| 5,296,743 | 3/1994 | Nguyen et al. ......................... | 257/784 |
| 5,302,850 | 4/1994 | Hara ....................................... | 257/667 |
| 5,359,227 | 10/1994 | Liang et al. ............................ | 257/786 |
| 5,457,340 | 10/1995 | Templeton, Jr. et al. ............... | 257/676 |
| 5,684,332 | 11/1997 | Chen et al. ............................. | 257/786 |
| 5,780,772 | 7/1998 | Singh et al. ............................ | 438/123 |
| 5,859,471 | 1/1999 | Kuraishi et al. ....................... | 257/668 |
| 5,869,898 | 2/1999 | Sato ....................................... | 257/666 |

FOREIGN PATENT DOCUMENTS

| | | | |
|---|---|---|---|
| 58-98445 | 12/1984 | Japan ..................................... | 257/659 |
| 63-6852 | 7/1989 | Japan ..................................... | 257/784 |
| 2-26786 | 9/1991 | Japan ..................................... | 257/687 |
| 2-325808 | 7/1992 | Japan ..................................... | 257/784 |

*Primary Examiner*—Donald L. Monin, Jr.
*Assistant Examiner*—Mike Dietrich
*Attorney, Agent, or Firm*—Jones Volentine, LLP

[57] ABSTRACT

Semiconductor devices having bonding wires are encapsulated in a fluid molding resin, and the flow front of the molding resin can displace the bonding wires and create a short of the device. A semiconductor IC device is provided with dummy bonding wires to prevent or reduce the wire displacement by blocking the remaining bonding wires from direct exposure to the molding resin flow front in the mold cavity. Wire displacement or sweep of the dummy bonding wires causes the dummy bonding wires to contact their adjacent remaining bonding wires, but this contact does not cause a short in the device. The size of the semiconductor IC device is thereby reduced by increasing the allowable length of the bonding wires in the device, resulting in improved yields and lower production costs.

10 Claims, 10 Drawing Sheets

SEMICONDUCTOR INTEGRATED CIRCUIT DEVICE HAVING DUMMY BONDING WIRES

BACKGROUND OF THE INVENTION

1. Field of the Invention

The present invention relates generally to a semiconductor integrated circuit (IC) device. More particularly, the present invention relates to a semiconductor IC device comprising dummy bonding wires which prevent shorts caused by wire sweep during the molding operation.

2. Background of the Related Art

Semiconductor integrated circuit (IC) devices require a means for electrically connecting the device to an external appliance. The electrical connection is typically accomplished by bonding wires which connect individual bonding pads on the device to respective leads of a substrate, such as a lead frame or printed circuit board. The bonding wires are usually made from gold, aluminum, or alloys thereof.

Continuing advancements in IC design and manufacturing have increased the integrity of semiconductor IC devices while decreasing the size of the devices. Thus, the numbers of leads and bonding pads are increasing while the size and pitch of the pads and the width and pitch of the leads are being reduced accordingly. However, reductions in the lead pitch are limited by device manufacturing conditions. In other words, the pitch is limited by mechanical manufacturing constraints.

In order the overcome such manufacturing constraints, the separation between the leads and the chip is increased so that more leads can be arranged around the chip, thus requiring an increase in the length of the bonding wires which connect the leads to the chip. A disadvantage of the long bonding wire is that they are more vulnerable to being displaced or dragged by the flow of molding resin entering the mold cavity during a transfer molding process. Such displacement, so-called wire sweep, causes adjacent bonding wires to contact each other and short the device.

Prevention of wire sweep during a transfer molding process using long bonding wires is an important requisite to reducing the size of the device. By reducing the device size, the number of individual devices per wafer is increased which results in increased productivity and a decrease in production costs. Although wire sweep is a common problem in the manufacture of all kinds of semiconductor IC devices, its greatest impact is on thin packages and multi-pin packages having a large number of I/O pins.

Current mass production techniques use bonding wires have a maximum length of 200 mils. The 200 mil limit results from molding operation constraints, not the wire bonding operation itself. In other words, although the wire bonding operation allows use of bonding wires that are 250 mils long, the wire sweeping caused by the molding resin flow during the molding operation prevents use of wires greater than 200 mils long.

Wire sweep in an existing semiconductor IC device will be described with reference to FIG. 1 through FIG. 4. FIG. 1 is a plan view depicting a conventional semiconductor IC device; FIG. 2 is a cross-sectional view taken along the line II—II in FIG. 1; FIG. 3 is a plan view depicting wire sweep caused by the flow of molding resin; and FIG. 4 is a cross-sectional view taken along the line IV—IV in FIG. 3, which depicts the location of bonding wires before and after the wire sweep occurs.

The IC device shown in FIG. 1 is a multi-pin package which is commonly called a QFP (Quad Flat Package). As depicted, the device has completed the wire bonding operation in which chip 10 is connected to leads of the lead frame 20 via bonding wires 30, and is ready for the subsequent molding operation. The chip 10 is attached to die pad 22 of lead frame 20, and the die pad 22 is coupled to the lead frame 20 via a plurality of, for example four (4), tie-bars 26 formed at corners of the lead frame 20. Leads 24 of the lead frame 20 are electrically connected to respective ones of corresponding bonding pads 12 of the chip 10 via bonding wires 30.

In the molding operation, the chip, electrical connections and die pad are encapsulated by a molding resin. The area inside the dashed line 40 will be encapsulated. FIG. 2 is a cross-sectional view taken along the line II—II in FIG. 1 and shows the device located in a mold 50. The gate 52, into which the molding compound enters, is located near one of four tie-bars 26 in FIG. 1. The molding resin flow enters into the mold cavity via the gate 52 in a flow direction indicated by arrows labeled 42 and fills the cavity 54 formed by upper and lower mold halves 50a, 50b.

Molding resin is a highly viscous fluid, and the bonding wires flex or are dragged in the direction of molding resin flow entering into the mold cavity 54. The resulting wire sweep caused by the molding resin flow 42 is shown in FIG. 3. FIG. 3 shows that most of bonding wires 30 bend or are displaced due to the force of the molding resin flow. In particular, the wire 30a ('outermost wire 30a') closest to the tie-bar 26 is subjected to the most severe bending forces such that it contacts adjacent wire 30b and shorts the device (at location 'S' in FIG. 3).

In FIG. 4, which is a cross-sectional view taken along the lines IV—IV in FIG. 1 and FIG. 3, the dislocation of bonding wires before and after the molding operation graphically shows the wire sweep. The location of the bonding wire before the molding operation is indicated by a solid line, while the location of the bonding wire after the molding operation is indicated by dotted line. As shown in FIG. 4, the dislocation of the outermost wire 30a is significantly greater than that of other wires 30b, 30c causing the outermost wire 30a to contact and short adjacent wire 30b. The remaining other wires 30b, 30c undergo an approximately equal amount of dislocation, which is less than the dislocation of wire 30a, causing no contact or short.

It is believed the reason why the outermost wire 30a undergoes the greatest dislocation is as follows. The distance ($d_1$), which is the separation across a tie-bar 26 between adjacent outermost bonding wires, is greater than the distance ($d_2$), which is the separation between adjacent bonding wires 30b and 30c. Because of the orientation of the tie-bar 26, the outermost wire 30a contacts a larger amount of the molding resin and is thus subjected to a greater bending force from the molding resin flow entering into the mold cavity than are the other wires 30b, 30c. The degree of sweep, which indicates the amount of sweep of individual bonding wires, is 4–6% for the outermost wire 30a and 2–3% for other wires 30b, 30c. Herein, the term 'degree of sweep' is defined as:

(Displacement at center of wire/wire length)×100.

For the IC device shown in FIGS. 1 to 4, the pitch of the bonding pads 12 is 75 μm, the pitch of the leads 24 is 200 μm (based on the inner end of the leads), and the distance between adjacent wires is approximately 136.5 μm at their centers. In addition, the length of the outermost wire 30a is 218 mil. Accordingly, if the displacement rates of the outermost wire 30a and of its adjacent wire 30b are 6% and 3%, respectively, the displacements of the outermost wire 30a and its adjacent wire 30b are 13 mils (≈330 μm) and 6.5 mils (≈165 μm), respectively. Thus, the displacement difference (165 μm) between these two wires 30a and 30b is far greater than the non-displaced distance (136.5 μm) between them, resulting in wire contact.

To avoid this wire sweep problem, semiconductor IC device manufacturers generally increase the pitch of bonding pads at corners of the chip so as to provide a sufficiently large space between adjacent wires to avoid wire contact or shorts, even if wire sweep occurs. A disadvantage of this approach however, is that it runs counter to the desired trend of reducing chip size.

Another approach is taught in U.S. Pat. No. 5,302,850 to Hara, which includes a modification to the structure of the mold cavity. As shown in FIG. 5, the inflow openings 62a and 62b are centrally located on upper and lower mold portions of mold 60, respectively, whereas the existing molds such as the mold shown in FIG. 2 have an inflow opening within the confines of the lower mold portion. According to the discussion in U.S. Pat. No. 5,302,850, the direction of resin flow and the direction of the bonding wires 64 connecting the semiconductor IC device with the leads are all approximately in radial conformance from the center of the device, thereby preventing wire sweep.

However, this approach also has a disadvantage in that, after the molding operation is carried out, the resulting package body has a bur at the center of its top and bottom surfaces at the inflow opening area. These burs cause problems in a subsequent marking operation in which a trade name and/or the name of the manufacturer are printed on the surface of the package. Another disadvantage of this approach is that it requires new molding equipment.

SUMMARY OF THE INVENTION

Thus, an object of the present invention is to solve one or more of the problems and disadvantages associated with wire sweep during the molding operation. This object is achieved while allowing a reduction in the size of the semiconductor IC device, and at the same time, increasing the allowable length of the bonding wire in the device. The semiconductor IC device of the present invention provides for an improvement in yield and a reduction in production cost.

According to the present invention, there is provided a semiconductor IC device comprising a quadrilateral shaped semiconductor IC chip having a plurality of bonding pads arranged on an active surface. More specifically, the plurality of bonding pads are arranged along each of the four edge portions of the active surface of the quadrilateral shaped IC chip.

The device further comprises a lead frame (or printed circuit board (PCB)) having a plurality of leads spaced apart from the chip and extending toward the chip. The bonding pads are electrically connected to respective ones of the corresponding leads via bonding wires. The chip, the lead frame (or printed circuit board) and the bonding wires are encapsulated by a molding resin to provide a package body. The IC device may be any of a QFP, TQFP, PLCC, SOP or TSOP when a lead frame is employed. A PCB substrate is used for ball grid array (BGA) packages.

The present invention seeks to reduce or prevent wire sweep for those bonding wires that are most exposed. The term 'exposed wires' refers to those wires which directly face the flow front of the molding resin entering into the mold cavity during the molding operation. The exposed wires undergo more severe wire sweep than all the other wires. According to the present invention, at least one dummy bonding wire blocks the exposed wires from directly contacting the flow front of the molding resin.

The exposed wires can be the bonding wires which connect the outermost bonding pad to the corresponding outermost lead, such as in the lead frame embodiments (described herein), or the first higher wire which is adjacent to a second lower wire, such as in the PCB embodiments (described herein). For the former case, the dummy bonding wires comprise two adjacent bonding wires connecting the die pad to the tie-bars, or a bonding wire connecting the dummy pad to the outermost lead. For the latter case, the dummy bonding wire can be a bonding wire which connects the insulating pad to the lead to which the exposed wires are connected. Or, the dummy bonding wire can be a bonding wire which connects the insulating pad to a dummy lead. Certain of dummy bonding wires embodiments employed for the lead frames packages can be adapted for use with ball grid array packages.

BRIEF DESCRIPTION OF THE ATTACHED DRAWINGS

These and various other features and advantages of the present invention will be described with reference to the accompanying drawings, wherein like reference numerals designate like structural elements, and, in which.

DETAILED DESCRIPTION OF PREFERRED EMBODIMENTS

Figure 1:
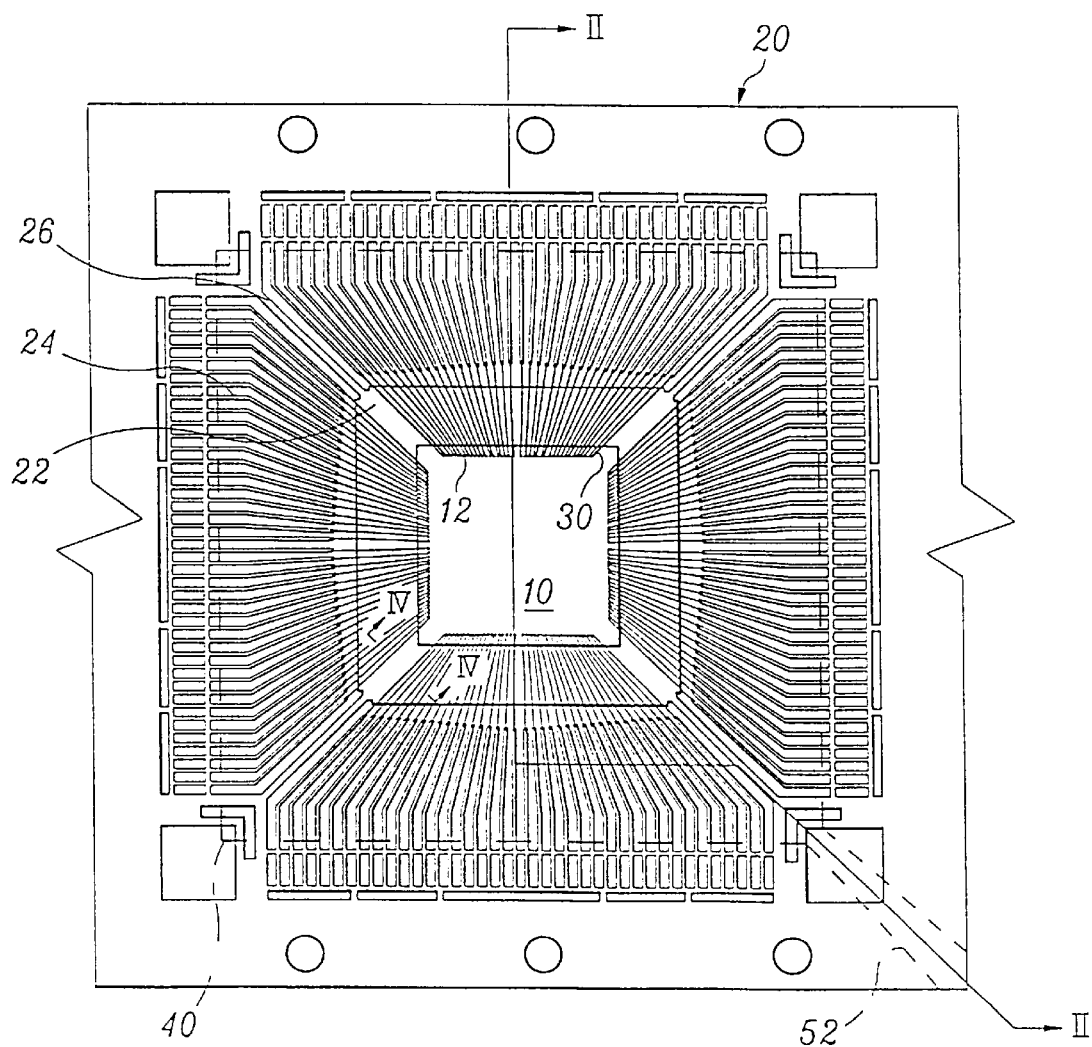
FIG. 1 is a plan view depicting a conventional semiconductor IC device.
Figure 2:
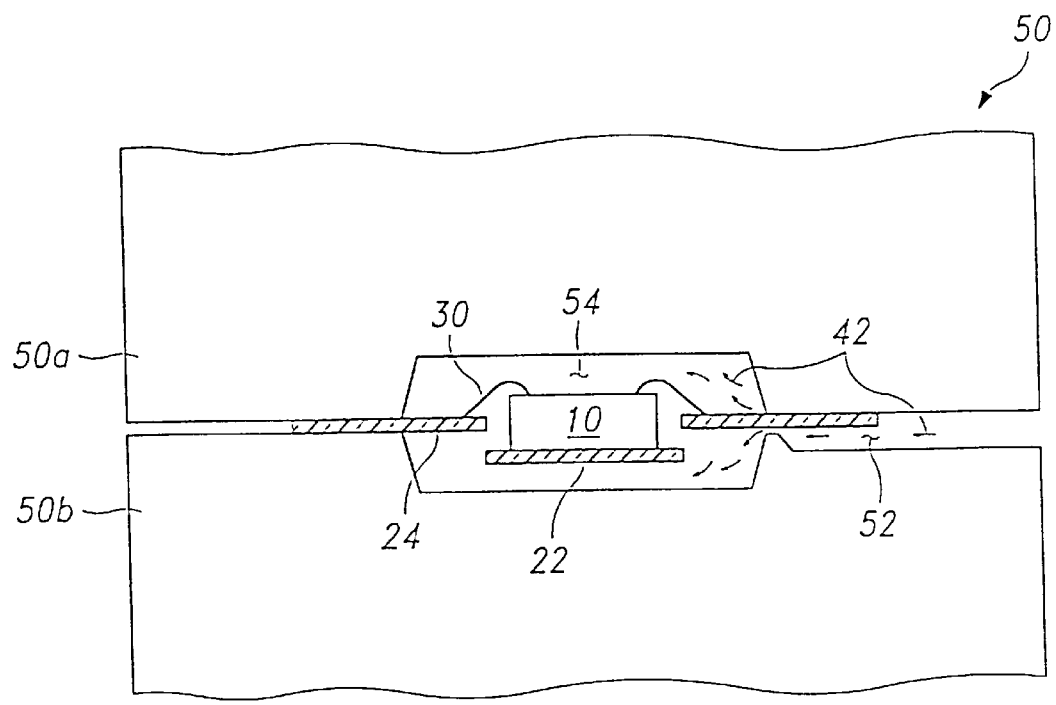
FIG. 2 is a cross-sectional view taken along the line II—II in FIG. 1.
Figure 3:
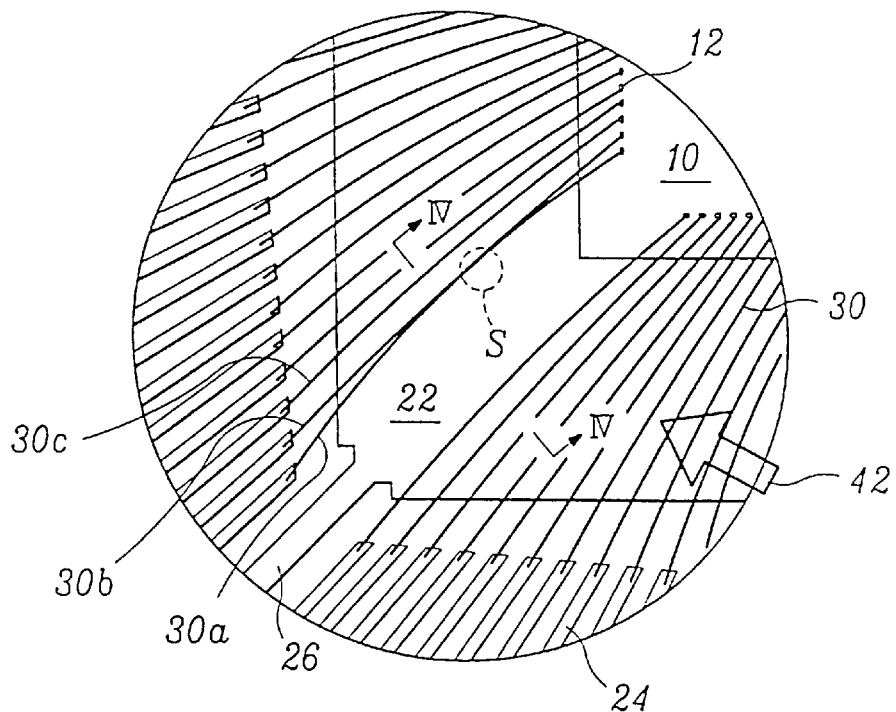
FIG. 3 is a plan view depicting the sweeping of bonding wires due to molding resin flow in the conventional semiconductor IC device.
Figure 4:
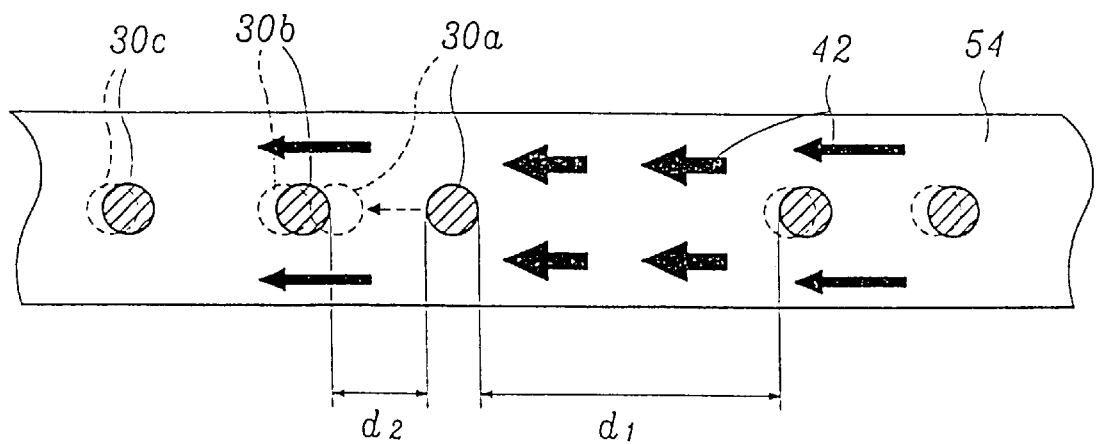
FIG. 4 is a cross-sectional view taken along the line IV—IV in FIG. 3, which depicts the location of bonding wires before and after the sweeping occurs.
Figure 5:
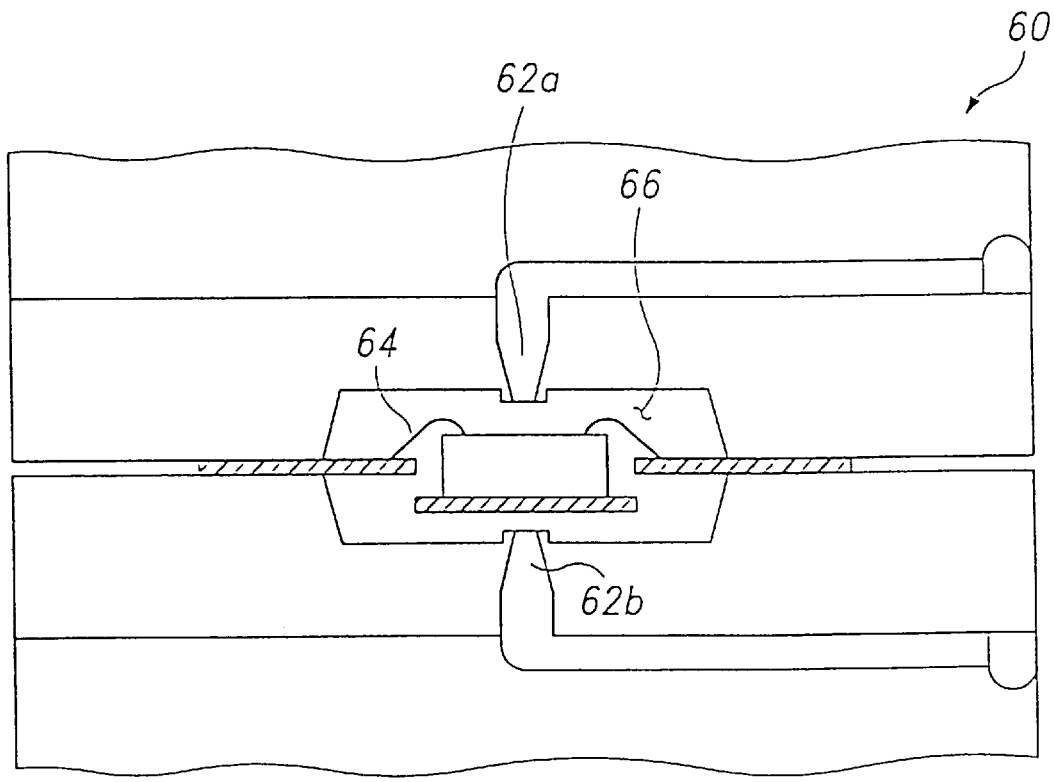
FIG. 5 is a cross-sectional view depicting a molding die in which the location of the gate where the molding resin is introduced is changed to prevent wire sweeping.
Figure 6:
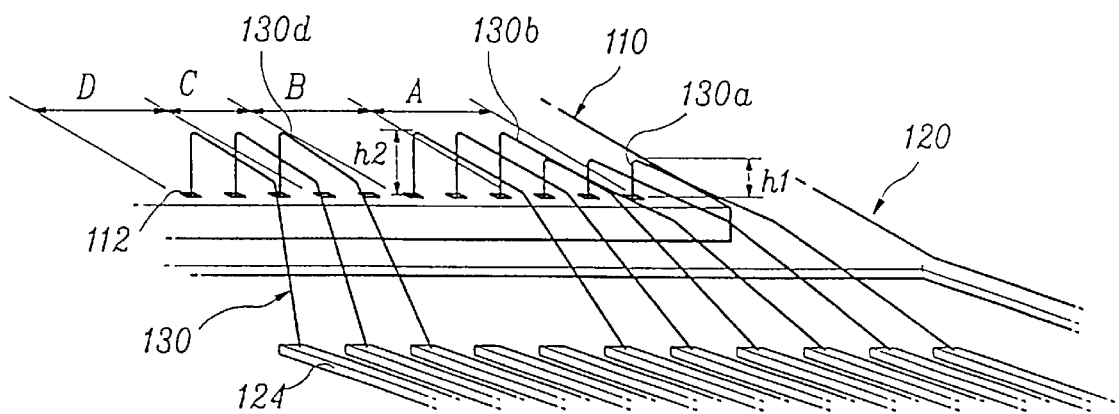
FIG. 6 is a perspective view depicting the configuration of bonding wires prior to the molding operation, the configuration being used in a simulation experiment to analyze the wire sweeping phenomenon.
Figure 7:
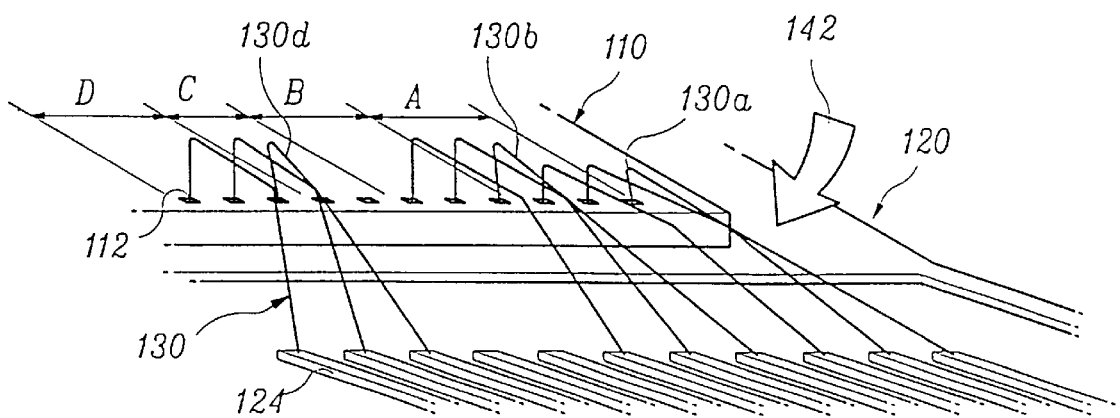
FIG. 7 is a perspective view depicting the configuration of bonding wires of FIG. 6 after the molding operation.

Prior to describing the invention in detail, attention is first directed to FIG. 6 and FIG. 7. FIG. 6 is a perspective view depicting the various configurations of bonding wires prior to the molding process, the configurations being used in a simulation experiment to analyze the wire sweep phenomenon. FIG. 7 is a perspective view depicting the configuration of the bonding wires of FIG. 6 after the molding process.

The parameters influencing wire sweep include, among others, the viscosity and rate of the molding resin flow, the length and height of the bonding wires, and the angle of the molding resin flow with respect to the bonding wires. Apparently, the most severe and predominant cause of the sweep of the outermost wire is the distance or interval between adjacent wires. Thus, the degree of wire sweep bears a close relationship with the degree of exposure of the wires to the molding resin flow front. To confirm this understanding, a simulation experiment was conducted under the conditions as herein described.

As shown in FIG. 6, one of the four edges of the chip 110 is divided into four segments A, B, C and D. Segment A contains bonding wires having a relatively low height (h1), segments B and D contain bonding wires having relatively greater heights (h2), and segment C contains no bonding wires. After the completion of the molding operation, of which results are shown in FIG. 7, the segments show the most severe wire sweeps, and therefore shorts, at the outermost wires 130a, 130b, 130d, which are directly exposed to the molding resin flow front 142.

The conditions and results of the simulation experiment are as follows:

Package type: 208QFP

Pitch of leads 124 of the lead frame 120: 200 $\mu$m

Size of chip 110: 4675 $\mu$m×4675 $\mu$m

Pitch of bonding pads 112: 75 $\mu$m

Diameter of bonding wire 130: 1.3 mils (33 $\mu$m)

Heights of bonding wires 130: 180–200 $\mu$m (h1) 450–470 $\mu$m (h2)

Length of bonding wire 130: 182–218 $\mu$m

Degree of wire sweep:

2.6% (for 130a) and 1.0–1.3% (for all wires of segment A except the outermost wire 130a);

5.8% (for 130b) and 1–3% (for all wires of segment B except the outermost wire 130b); and 4% (for 130d) and 1–2% (for all wires of segment D except the outermost wire 130d).

The results show that the outermost wires 130a, 130b, 130d, which contact the molding resin flow front earliest, undergo the most severe wire sweep, and therefore cause a short of the device. The wires of segment B, which have a similar interval between adjacent wires to that of the wires of segment A, but have greater heights, undergo a severe wire sweep to almost the same extent as the wire sweep in segment D. Segment D is located downstream of segment C where there are no wires, and therefore the wires 130d in segment D are subjected to severe and direct bending forces by the molding resin flow. Note that the wires in segment A undergo a relatively smaller sweep than the wires in other segments. However, the height of the wires in the segment A are too small to provide sufficient bonding strength, causing difficulties in mass production of the device.

Accordingly, from the simulation it can be understood that sweep of a certain wire which is exposed to the molding resin flow front earliest as the resin enters the mold cavity is significant, and that a decrease of the exposure to the resin flow front can prevent or effectively reduce the wire sweep. Alternatively, all the wires may be configured to be exposed to the resin flow front to a similar degree so that every wire can undergo a similar degree of sweep. In another aspect, the device can be designed so that the expected sweep and the resultant short will not affect the function of the device.

Figure 8:
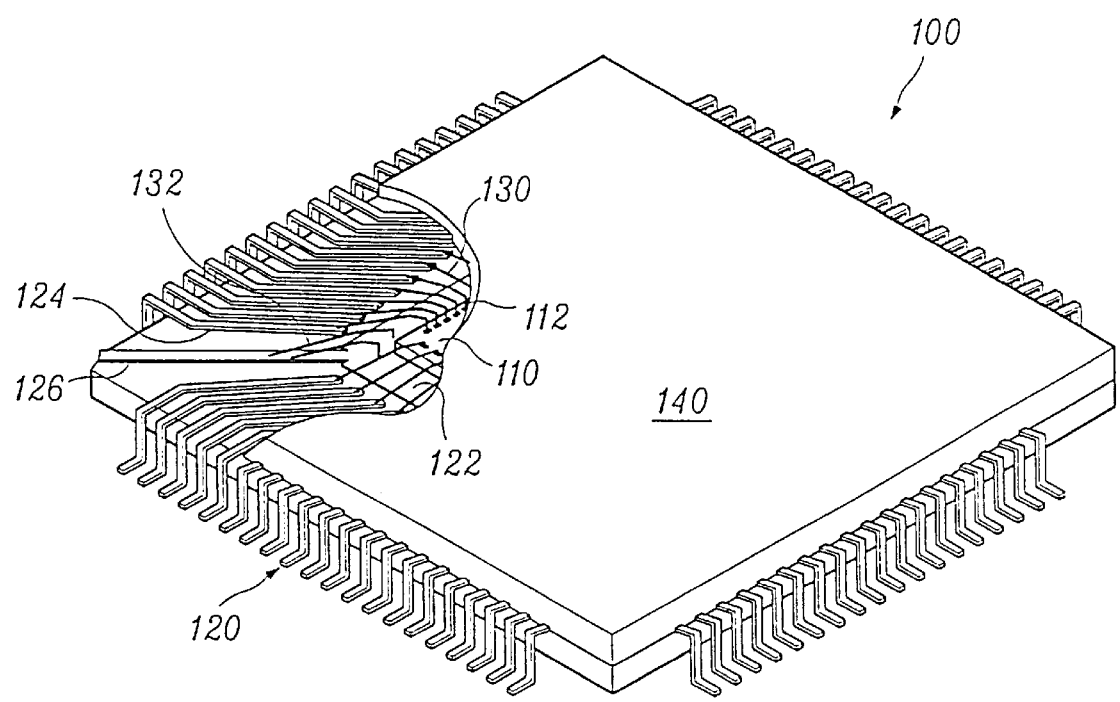
FIG. 8 is a partial cut-away perspective view depicting a package of a semiconductor IC device comprising the dummy bonding wires according to a first embodiment of the present invention.
Figure 9:
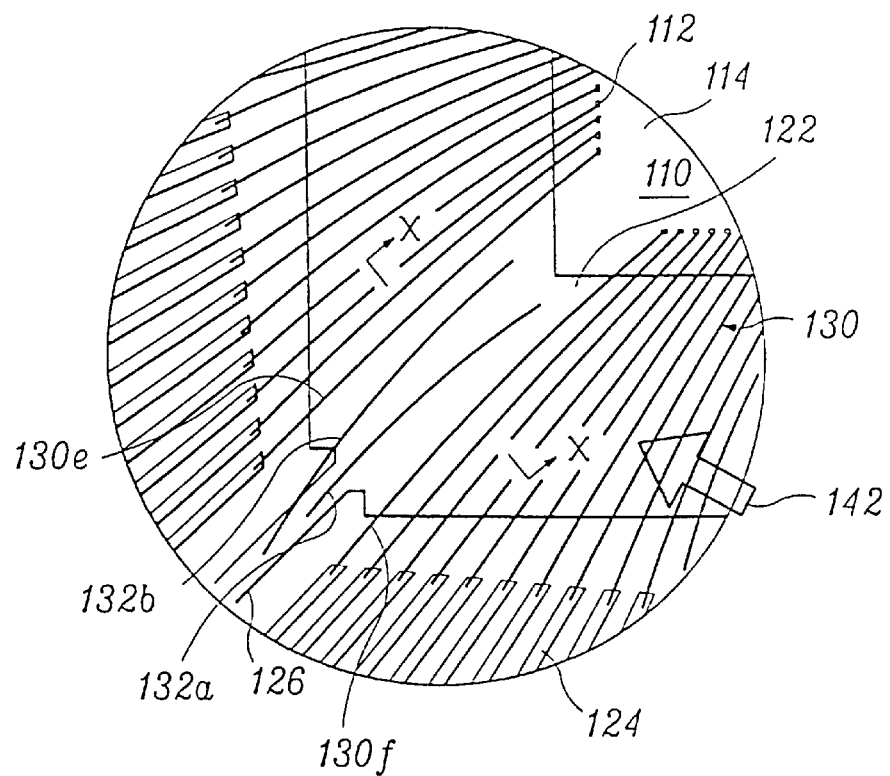
FIG. 9 is a partial enlarged plan view depicting the configuration of the dummy bonding wires during the molding operation of the device in FIG. 8.

With regard to a first embodiment of the present invention, FIG. 8 is a partial cut-away perspective view depicting a package of the semiconductor IC device comprising dummy bonding wires; FIG. 9 is a partial enlarged plan view depicting the configuration of the dummy bonding wires during the molding operation of the device in FIG. 8; and FIG. 10 is a cross-sectional view taken along the line X—X in FIG. 9.

Figure 10:
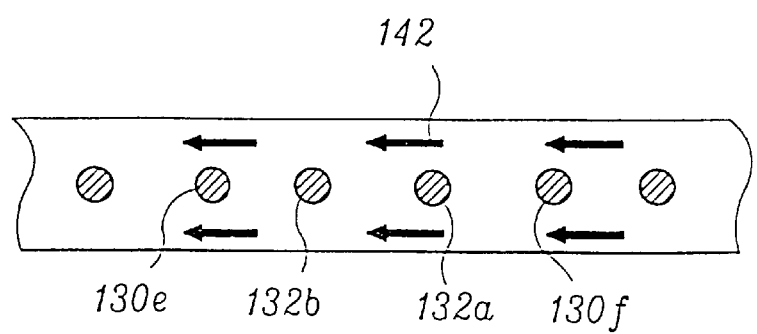
FIG. 10 is a cross-sectional view taken along the line X—X in FIG. 9.

With reference to FIGS. 8 to 10, the semiconductor IC device 100 comprises a quadrilateral shaped semiconductor IC chip 110, with an active surface 114. A plurality of bonding pads 112 are arranged on the active surface along each of the four edge portions of the active surface 114. The chip 110 is attached to a die pad 122 of a lead frame 120. Tie-bars 126 extending from the corners of the die pad 122 support the die pad 122 and the chip 110 during the package assembly process. Leads 124 of the lead frame 120, which are spaced apart from and arranged around the chip 110, extend radially from the lead frame toward the chip 110.

Leads 124 are electrically connected to respective ones of the bonding pads 112 via bonding wires 130. The chip 110, leads 124, and bonding wires 130 are encapsulated to form a package body 140. The portion of the leads 124 extending outward from the body 140 are formed so as to provide a proper configuration for mounting to an external PCB or electronic appliance (not shown), thereby forming a complete IC package 100.

The package shown in FIG. 8 is an example of a quad flat package (QFP). Every wire 130, except the outermost wires 130e, 130f (see FIG. 9), have the same interval or distance between adjacent wires. The outermost wires 130e and 130f formed adjacent to one of the sides of the tie-bar 126 have a greater interval than the other wires. Accordingly, as described previously, when the molding resin enters into the mold cavity, the outermost wire 130e would be exposed earliest to the flow 142 front, and would undergo the most severe sweep, causing a short with the adjacent wires. Generally, to avoid this wire sweep and short, at least one dummy bonding wire is positioned near or at the tie-bar 126 and between the outermost wires 130e, 130f, so as to reduce the interval of the outermost wires 130e, 130f, thereby making the degree of sweep of the outermost wire 130e similar to that of the other wires and preventing the short. Although only one dummy wire need by provided, it can be appreciated that a plurality of dummy bonding wires may be provided, depending on the spacing between the outermost wires, so as to more closely match the interval between the remaining wires.

As shown in FIG. 9, for example, two dummy bonding wires 132a, 132b may be formed by coupling the tie-bar 126 to the remaining part of the die pad where the chip 110 is not attached. The dummy bonding wires may also be connected to a dummy lead as well, similar to the embodiment shown in FIG. 16 as described later. To reduce the pressure applied to the outermost wire 130e from the molding resin flow, it is preferable to make the height of the dummy bonding wires 132a, 132b the same as that of the outermost wire 130e.

With further regard to the spacing of the dummy bonding wires, note that it is important that the dummy bonding wires 132 be provided so that the interval between them and the outermost wire 130e (i.e., the bonding wire downstream of the flow direction 142 of the molding compound) is nearly the same or the same as that of the other wires 130. By contrast, the interval between the dummy bonding wires 132 and the outermost wire 130f (i.e., the bonding wire upstream of the flow direction 142 of the molding compound) is not as significant. If dummy bonding wire 132a, which faces the molding resin flow front earliest, undergoes a severe sweep and then shorts to the next adjacent dummy bonding wire 132b, no short occurs in the device since the dummy bonding wires 132a and 132b are coupled to the tie-bar 126 and do not have an electrical function. This explains why it is preferable to have two dummy bonding wires adjacently formed. If only one dummy bonding wire was provided, its spacing should be selected to decrease the molding compound flow front sufficiently so as minimize sweep of itself and the downstream outermost bonding wire.

Figure 11:
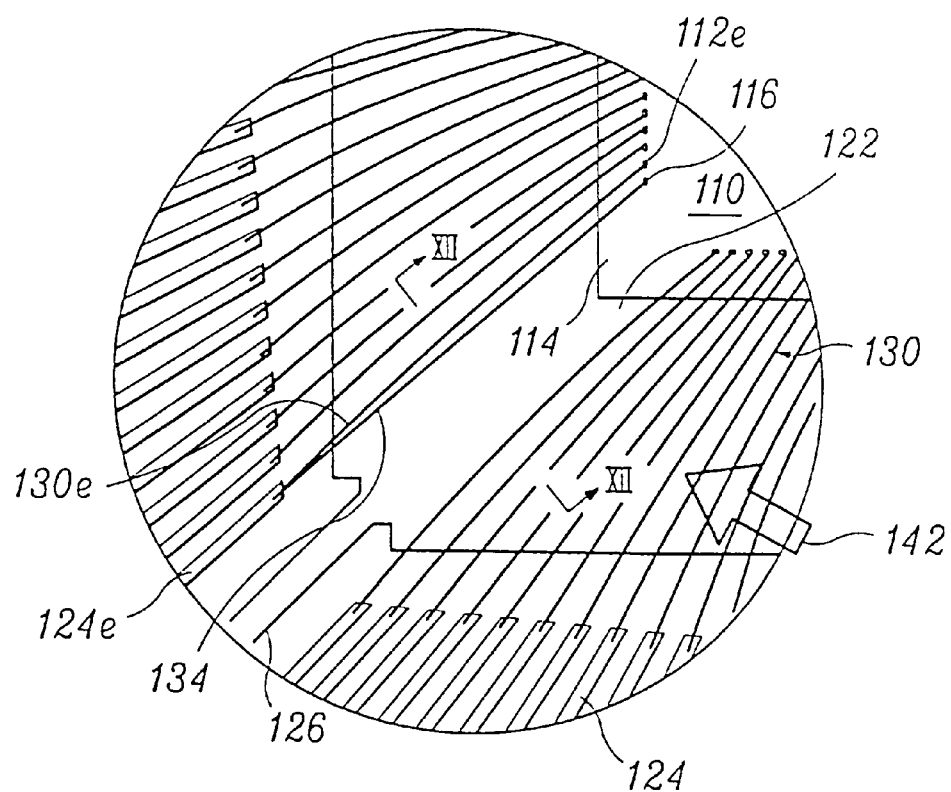
FIG. 11 is a partial plan view depicting a configuration of the dummy bonding wires in a semiconductor IC device, the dummy bonding wires being configured according to a second embodiment of the present invention.
Figure 12:
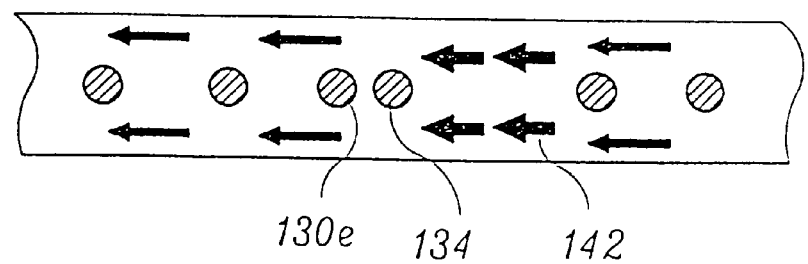
FIG. 12 is a cross-sectional view taken along the line XII—XII in FIG. 11.

FIG. 11 is a partial plan view depicting the configuration of the dummy bonding wires in a semiconductor IC device, the dummy bonding wires being configured according to a second embodiment of the present invention; and FIG. 12 is a cross-sectional view taken along the line XII—XII in FIG. 11. With reference to FIGS. 11 and 12, the semiconductor IC device has the same structure as that of the first embodiment described above, except that the dummy bonding wire 134 is provided in a different configuration. According to the second embodiment, one dummy pad 116 is additionally formed on the active surface 114 of the chip 110 at a position adjacent an outermost bonding pad 112e and closer to the corner of the chip 110. The dummy bonding pad 116 has the same function as that of the outermost bonding pad 112e, that is, to anchor one end of the bonding wire to the chip. The dummy bonding pad 116 is connected to the outermost lead 124e via dummy bonding wire 134. Thus, the outermost lead 124e is connected to both the outermost bonding pad 112e and to the dummy pad 116 via two separate wires 130e and 134, respectively. When the molding resin flow enters into the mold cavity, the dummy bonding wire 134 faces the flow front earliest, and thus is subjected to the most severe sweep as shown in FIG. 12. However, since the outermost wire 130e is connected to the dummy bonding pad 116 as well as to the outermost bonding pad 112e, which have the same function regardless of their different locations, the contact and short of the outermost wire 130e to the dummy bonding wire 134 will cause no problem.

Although these first and second embodiments were described with regard to a representative multi-pin QFP package, they can be applied to other types of packages. In particular, they can be applied to other multi-pin packages such as PLCC (Plastic Leaded Chip Carrier), to thin packages such as SOP (Small Outline Package), TSOP (Thin Small Outline Package) or TQFP (Thin Quad Flat Package), and to BGA (Ball Grid Array) packages.

Figure 13:
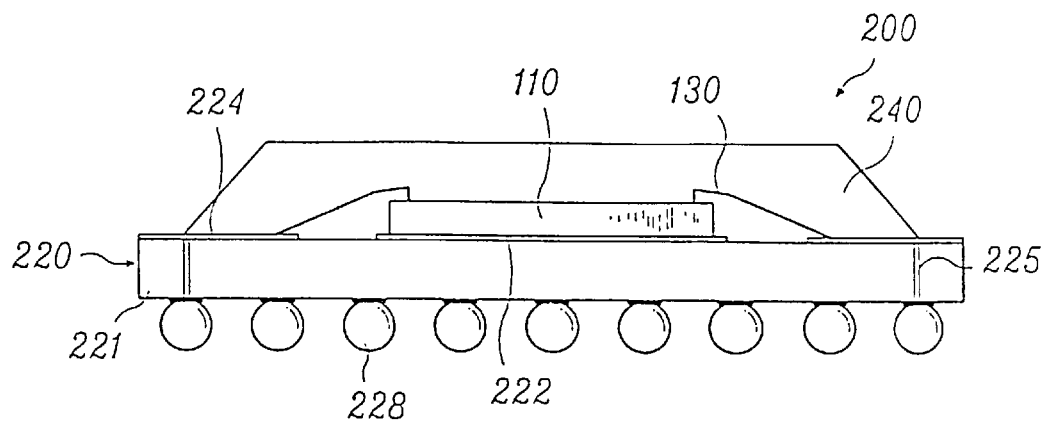
FIG. 13 is a side view depicting another package of the semiconductor IC device comprising the dummy bonding wires according to the present invention.

FIG. 13 is a side view depicting a ball grid array (BGA) package comprising the dummy bonding wires according to the present invention. In the BGA package 200, a printed circuit board (PCB) 220 serves as the external electrical connection means unlike the QFP in which the lead frame serves that function. The PCB 220 comprises a die pad 222 to which the chip 110 is attached, and leads 224 (or wired patterns) which are connected to the chip 110 via wires, like the lead frame of the QFP. The PCB 220 differs from the lead frame in that the die pad 222 and leads 224 are formed on an insulating resin body 221 and electrically connected to solder balls 228 via through holes 225 formed in the insulating resin body 221. The reference numeral 240 in FIG. 13 indicates an encapsulated package body.

The BGA package 200 also may be subject to shorts due to wire sweep, and the first and second embodiments of the present invention described above can be applied to the BGA package as well. The structure of the BGA package, however, provides for other possible dummy bonding wire configurations.

Figure 14:
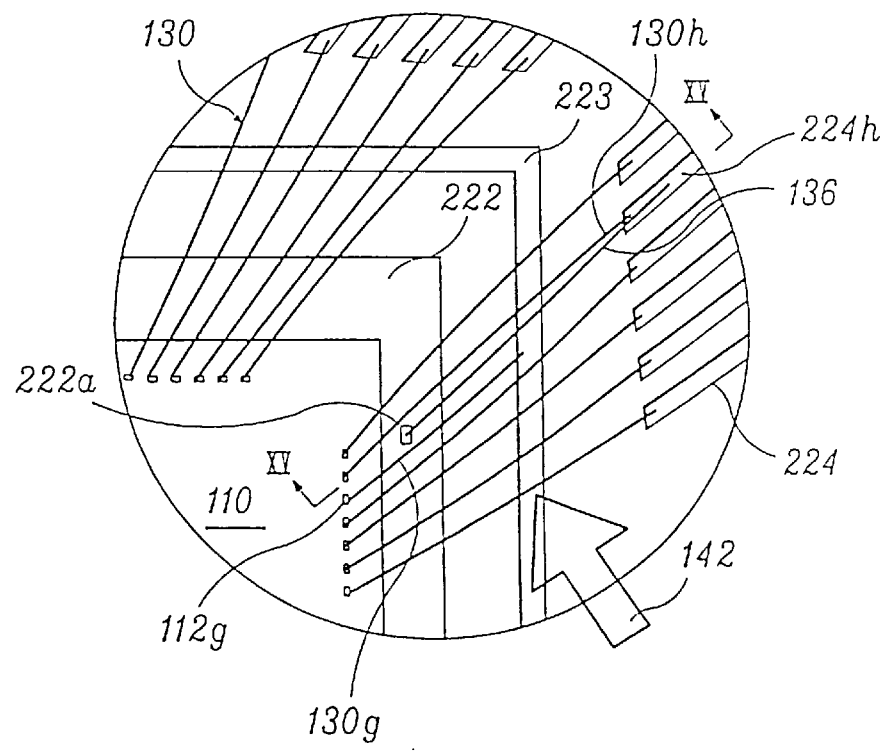
FIG. 14 is a partial plan view depicting a configuration of the dummy bonding wires in a semiconductor IC device, the dummy bonding wires being configured according to a third embodiment of the present invention.

The BGA package may have power supply terminals or ground terminals located between the die pad and the leads, for example as indicated by reference numeral 223 in FIG. 14. These terminals are usually formed as a path, possibly ring-shaped, around the die pad, and are electrically connected to a respective one or more of the bonding pads 112g on the chip by bonding wires 130g.

The bonding wires 130g connected to the power supply terminals or ground terminals generally have a lower height than other bonding wires 130 connected to the wired patterns 224. However, the presence of these lower height bonding wires 130g does not protect the full-height bonding wires 130 from the effects of wire sweep and subsequent shorts (see segments A and B in FIG. 7). Therefore, the following third and fourth embodiments of the present invention are provided for BGA packages.

Figure 15:
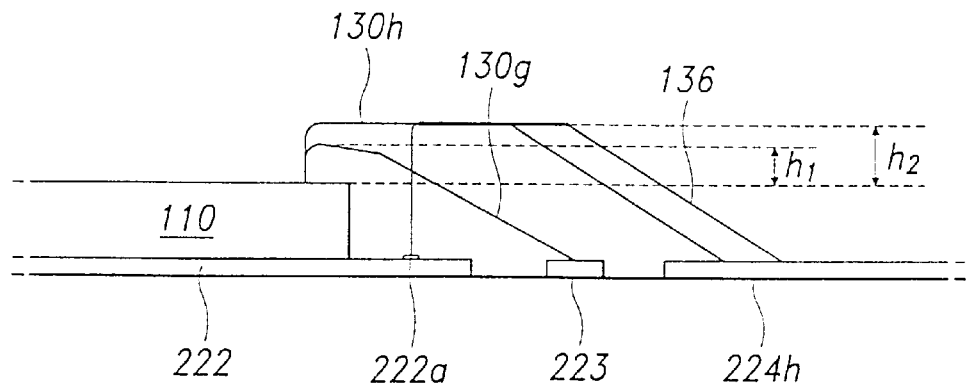
FIG. 15 is a cross-sectional view taken along the line XV—XV in FIG. 14.

FIG. 14 is a partial plan view depicting the configuration of the dummy bonding wire in a semiconductor IC device, the dummy bonding wire being configured according to the third embodiment of the present invention; and FIG. 15 is a cross-sectional view taken along the line XV—XV in FIG. 14. With reference to FIGS. 14 and 15, the power supply terminal 223 (or ground terminal) is provided between the die pad 222 to which the chip 110 is attached and the leads 224. One of the bonding pads 112g is electrically connected to the power supply terminal 223 via bonding wires 130g, and the bonding wire 130g has a lower height '$h_1$' than the height '$h_2$' of other wires. Therefore, the wire 130h ('exposed wire') adjacent to the wire 130g is directly exposed to the molding resin flow front 142 and subjected to the most sweep and resulting shorts.

To avoid the wire sweep due to the difference between the wire heights, a dummy bonding wire 136 is provided between the exposed wire 130h and the smaller wire 130g. The dummy bonding wire 136 connects an insulating pad 222a to the lead 224h to which the exposed wire 130h is connected. The dummy bonding wire 136 has the same height '$h_2$' as the exposed wire 130h. Therefore, the sweep of the dummy bonding wire 136 and resultant short thereof cause no problem.

Figure 16:
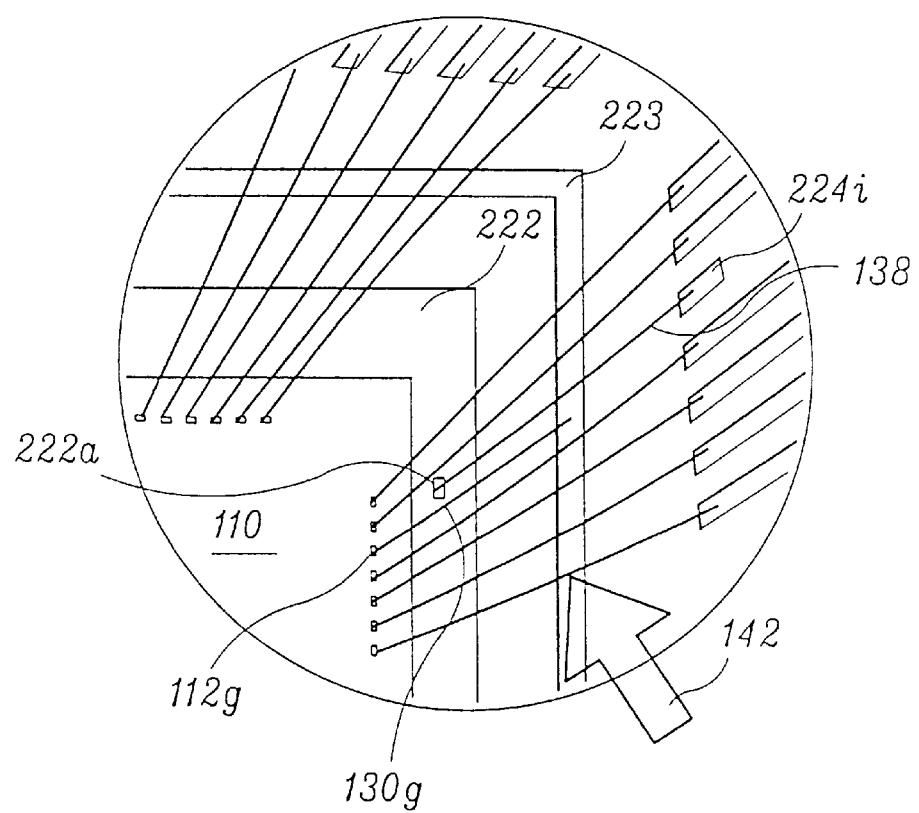
FIG. 16 is a partial plan view depicting a configuration of the dummy bonding wires in a semiconductor IC device, the dummy bonding wires being configured according to a fourth embodiment of the present invention.

FIG. 16 is a partial plan view depicting the configuration of the dummy bonding wires in a semiconductor IC device, the dummy bonding wires being configured according to the fourth embodiment of the present invention. This embodiment differs from the third embodiment in that, for this embodiment, the dummy bonding wire 138 connects the insulating pad 222a to a dummy lead 224i. The dummy lead 224i is an isolated lead, which is not electrically connected to any external contacts such as a solder ball (shown at reference numeral 228 in FIG. 13). Therefore, the sweep of the dummy bonding wire 138 and resultant short thereof cause no problem.

In summary, the present invention allows prevention of wire sweep and resulting shorts of the semiconductor IC device during the molding operation, whereby limits on increasing the length of the bonding wire can be effectively reduced. Accordingly, a reduction in the size of the chip and an increase in the number of chips per wafer can be accomplished, resulting in an improved yield and reduced production cost.

Moreover, the present invention is advantageous in that it can be embodied and applied to various packages by using existing equipment with slight modification to the programs concerning the wire bonding operation.

Although preferred embodiments of the present invention have been described in detail hereinabove, it should be clearly understood that many variations and/or modifications of the basic inventive concepts herein taught which may appear to those skilled in the art will still fall within the spirit and scope of the present invention as defined in the appended claims.

What is claimed is:

1. A semiconductor integrated circuit (IC) device comprising:

a quadrilateral semiconductor IC chip having an active surface and a plurality of bonding pads arranged along each of edge portions of the active surface;

a substrate having a plurality of leads spaced apart from the chip and extending toward the edge portions of the ship;

a plurality of bonding wires for electrically connecting the leads to respective ones of the corresponding bonding pads, the plurality of bonding wires including adjacently-spaced first bonding wires and second bonding wires, the first bonding wires having a greater height than the height of the second bonding wires;

a package body for encapsulating the chip, the substrate, and the bonding wires, the package body comprising a fluid molding resin formed in a mold cavity, wherein the first bonding wire is an exposed wire that is directly exposed to a flow front flowing in a direction of the fluid molding resin entering into the mold cavity, whereby the exposed wire undergoes a greater wire sweep than a wire sweep of other bonding wires; and a dummy wire disposed upstream, with reference to the flow front direction of the fluid molding resin, of the exposed wire, wherein the dummy wire is connected at a first end to a selected one of the lead, the selected lead also being connected to the exposed wire wherein the dummy wire has a height that is equal to a height of the exposed wire, and wherein the substrate further comprises a die pad to which the chip is attached and an insulating pad provided on one surface of the die pad, wherein the dummy wire is connected at a second end to the insulating pad.

2. A semiconductor integrated circuit (IC) device comprising:

a quadilateral semiconductor IC chip having an active surface and a plurality of bonding pads arranged along each of edge portions of the active surface;

a substrate having a plurality of leads spaced apart from the chip and extending toward the edge portions of the chip;

a plurality of bonding wires for electrically connecting the leads to respective ones of the corresponding bonding pads; and a package body for encapsulating the chip, the substrate, and the bonding wires, the package body comprising a fluid molding resin formed in a mold cavity, wherein the bonding wires comprise at least one first bonding wire and at least one second bonding wire, the first bonding wire having a height lower than a height of the second bonding wire, the first bonding wire being located adjacent to the second bonding wire, the bonding wires further comprising, in addition to the bonding wires, at least one dummy wire having a height equal to the height of the second bonding wire, the at least one dummy wire being located between the first bonding wire and its adjacent second bonding wire, wherein the substrate further comprises a die pad to which the chip is attached and at least one power supply terminal or ground terminal provided around the die pad, wherein the at least one first bonding wire connects one of the bonding pads of the chip to the at least one power supply terminal or ground terminal.

3. The semiconductor IC device of claim 2, wherein said die pad is provided with an insulating pad on one surface of said die pad, and wherein said dummy wire connects said insulating pad to a lead that is connected to said second bonding wire.

4. The semiconductor IC device of claim 2, wherein said die pad is provided with an insulating pad on one surface of said die pad; and further comprising dummy leads provided between said plurality of leads, said dummy leads not electrically connected to external appliances; wherein said dummy wire connects said insulating pad to a respective one of said dummy leads.

5. A semiconductor integrated circuit (IC) device comprising:

a quadrilateral semiconductor IC chip having an active surface and a plurality of bonding pads arranged along each of edge portions of the active surface;

a substrate having a plurality of leads spaced apart from the chip and extending toward the edge portions of the chip;

a plurality of bonding wires for electrically connecting the leads to respective ones of the corresponding bonding pads;

a package body for encapsulating the chip, the substrate and the bonding wires, the package body comprising a fluid molding resin formed in a mold cavity;

wherein the bonding wires comprise first bonding wires and second bonding wires, the first bonding wires having a greater height than a height of the second bonding wires, wherein one of the first bonding wire is an exposed wire which is directly exposed to a flow front flowing in a direction of the fluid molding resin entering into the mold cavity, whereby the exposed wire undergoes a greater wire sweep than a wire sweep of other bonding wires;

a dummy wire disposed upstream, with reference to the flow front direction of the fluid molding resin, of the exposed wire; and a die pad to which the chip is attached and an insulating pad provided on the die pad, wherein the dummy wire is connected at a first end to the insulating pad, wherein the dummy wire has a height which is substantially equal to a height of the exposed wire.

6. The semiconductor IC device of claim 5, wherein the dummy wire is connected at a second end to a selected one of the leads, the selected lead also being connected to the exposed wire.

7. The semiconductor IC device of claim 5, wherein the dummy wire is connected at a second end to a selected one of the leads, the selected lead being non-electrically connected dummy lead.

8. A semiconductor integrated circuit (IC) device comprising:

a quadrilateral semiconductor IC chip having an active surface and a plurality of bonding pads arranged along each of edge portions of the active surface;

a substrate having a plurality of leads spaced apart from the chip and extending toward the edge portions of the chip;

a plurality of bonding wires for electrically connecting the leads to respective ones of the corresponding bonding pads, wherein the bonding wires comprise at least one first bonding wire, at least one second bonding wire, and at least one dummy wire in addition to the first and second bonding wires, the first bonding wire having a height greater than a height of the second bonding wire, the dummy wire having a height substantially equal to the height of the first bonding wire, and the dummy wire being located between the first bonding wire and its adjacent second bonding wire;

a die pad to which the chip is attached mid at least one power supply terminal or ground terminal provided around the die pad, wherein the second bonding wire connects one of the bonding pads of the chip to the power supply terminal or ground terminal; and a package body for encapsulating the chip, the substrate and the bonding wires, the package body comprising a fluid molding resin formed in a mold cavity.

9. The semiconductor IC device of claim 8, wherein the die pad is provided with an insulating pad on the die pad, wherein the first bonding wire comprises a certain bonding wire which is spaced apart from its adjacent first bonding wires at a larger interval than remaining first bonding wires are spaced apart from each other, and wherein the dummy wire connects the insulating pad to a lead that is connected to the certain bonding wire.

10. The semiconductor IC device of claim 8, further comprising a dummy lead in addition to the plurality of leads, the dummy lead being provided between the plurality of leads and not being electrically connected to external appliances, wherein the die pad is provided with an insulating pad on the die pad, and wherein the dummy wire connects the insulating pad to the dummy lead.

* * * * *